(12) United States Patent
Heid

(10) Patent No.: US 6,496,005 B2
(45) Date of Patent: Dec. 17, 2002

(54) MAGNETOMETER FOR DETECTING A MAGNETIC FIELD ASSOCIATED WITH NUCLEAR MAGNETIC SPINS OR ELECTRON SPINS

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/860,146

(22) Filed: May 17, 2001

(65) Prior Publication Data

US 2001/0043065 A1 Nov. 22, 2001

(30) Foreign Application Priority Data

May 22, 2000 (DE) .......................................... 100 25 273

(51) Int. Cl.$^7$ ................................................. G01V 3/00
(52) U.S. Cl. ...................................... 324/301; 324/322
(58) Field of Search ................................ 324/301, 300, 324/302, 304, 307, 309, 318, 322

(56) References Cited

U.S. PATENT DOCUMENTS 2,772,391 A * 11/1956 Mackey ....................... 324/301
5,404,103 A * 4/1995 Duret .......................... 324/300
5,530,348 A * 6/1996 Heflinger ..................... 324/301

OTHER PUBLICATIONS

"An Automatic Tracking Nuclear Magnetic Resonance Gaussmeter," Lue, Nuclear Instruments And Methods, vol. 147 (1977), pp. 595–598.
"Kernspin–Tomographie für die Medizinische Diagnostik," Bösiger (1985), Chapter 2.4, pp. 16–20.

* cited by examiner

Primary Examiner—Louis Arana
(74) Attorney, Agent, or Firm—Schiff Hardin & Waite

(57) ABSTRACT

A magnetometer for, among other things, measuring a magnetic field, associated with nuclear magnetic spins or electron spins received a specimen of a material that exhibits nuclear magnetic resonance or electron spin resonance at a resonant frequency $\gamma \cdot B_m$ that is dependent on a magnetic flux density $B_m$ of the magnetic field to be measured. The magnetometer has a transmission device for emitting a transmission signal into the specimen at at least one prescribable transmission frequency $\omega_1$ that has a frequency spacing from the resonant frequency $\gamma \cdot B_m$, and a reception device for receiving a mixed signal with mixed frequencies containing the resonant frequency $\gamma \cdot B_m$ and the transmission frequency $\omega_1$ and for filtering out the resonant frequency $\gamma \cdot B_m$ from at least one of the mixed frequencies as an indicator for the magnetic flux density $B_m$.

10 Claims, 5 Drawing Sheets

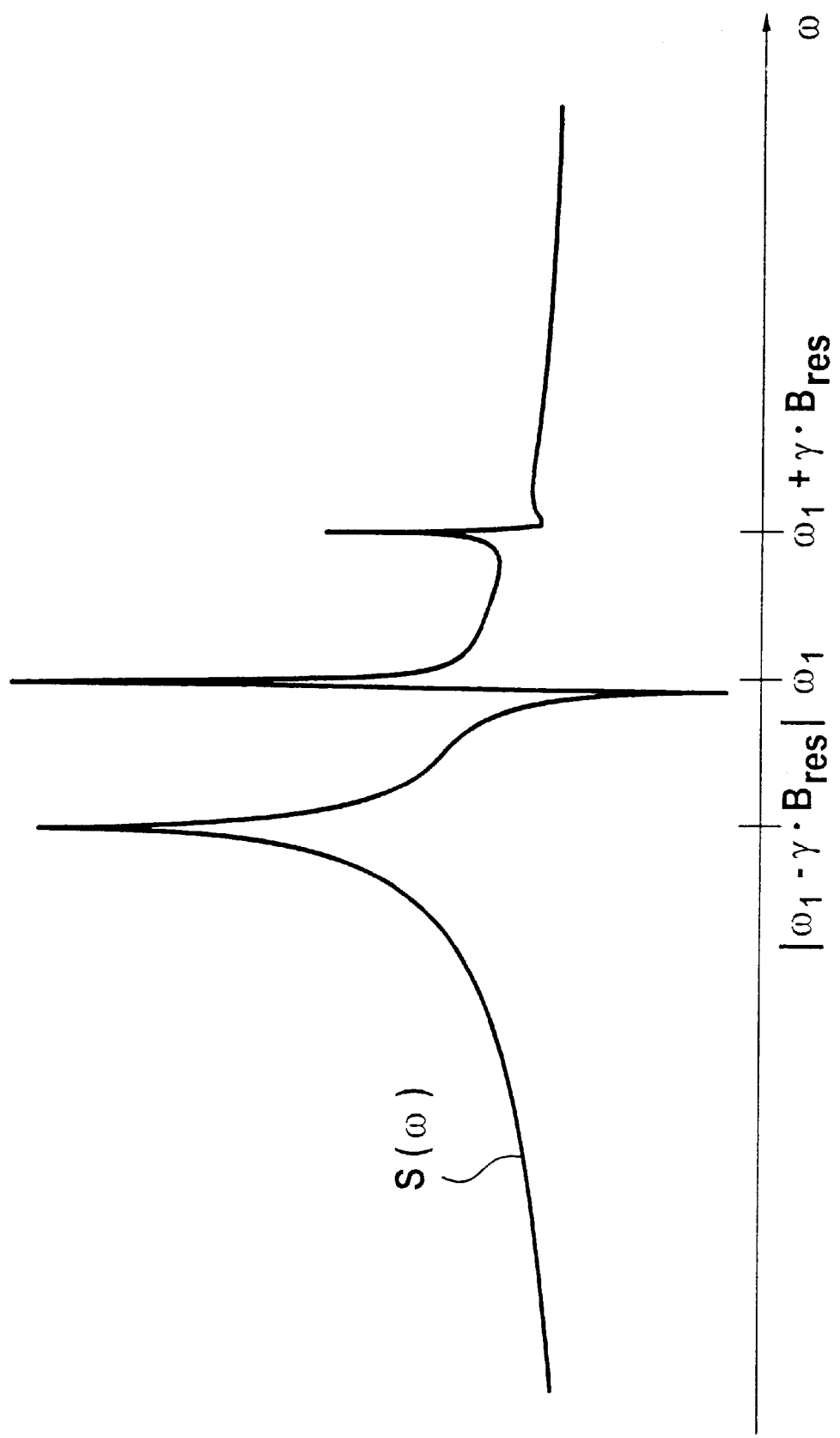

MAGNETOMETER FOR DETECTING A MAGNETIC FIELD ASSOCIATED WITH NUCLEAR MAGNETIC SPINS OR ELECTRON SPINS

BACKGROUND OF THE INVENTION

1. Field of the Invention

The invention is directed to a magnetometer for, among other things, measuring a magnetic field associated with nuclear magnetic spins or electron spins.

2. Description of the Prior Art

With known nuclear magnetic spin or electron spin magnetometers for measuring a magnetic field with a specimen of a material that produces nuclear magnetic resonance or electron spin resonance and whose resonant frequency is a measure for a magnetic flux density of the magnetic field to be measured, the specimen is employed as a frequency-selective absorber or as a linear component. To that end, the known nuclear magnetic spin or electron spin magnetometers have a transmission device for radiating a transmission signal into the specimen with a controllable transmission frequency. The transmission frequency is regulated by a regulating device so that it is continually re-adjusted to the resonant frequency, which changes dependent on the magnetic flux density given a temporally varying magnetic field. As a result, the transmission frequency is equal to or nearly equal to the resonant frequency at every point in time. This results in the resonant frequency of interest being difficult to detect with the isofrequency transmission frequency as a consequence of the noise signals that are thereby introduced. This, further, requires that the control device be designed with a comparatively small bandwidth, so that narrow limits are placed on the tracking speed of the resonant frequency in the case of magnetic fields that change rapidly over time.

SUMMARY OF THE INVENTION

An object of the present invention is to provide an improved nuclear magnetic spin or electron spin magnetometer that, among other things, alleviates the aforementioned disadvantages.

This object is inventively achieved by a nuclear magnetic spin or electron spin magnetometer for, among other things, measuring a magnetic field which is adopted to receive a specimen of a material that produces nuclear magnetic resonance or electron spin resonance having a resonant frequency that is dependent on a magnetic flux density of the magnetic field to be measured, and having a transmission device for emitting a transmission signal into the specimen with at least one prescribable transmission frequency that has a frequency spacing from the resonant frequency, and a reception device for receiving a mixed signal with mixed frequencies containing the resonant frequency and the transmission frequency and for filtering out the resonant frequency from at least one of the mixed frequencies as a criterion (indicator) for the magnetic flux density.

A spin resonance of the specimen is thereby used as a non-linear component. The essentially fixed transmission frequency thus can be prescribed such that the utilized mixed frequency of the mixed signal can be filtered out by a broadband filter having a short transit time. A signal oscillating at the resonant frequency that represents an indicator or identifier for the magnetic flux density to be measured can be ultimately acquired by a following mixing of the filtered mixed signal with a signal oscillating with the transmission frequency. Among other things, magnetic fields that change arbitrarily fast in time thus can also be measured. A re-adjustment of the transmission frequency is not necessary, and therefore a control device for such re-adjustment is not necessary.

In an embodiment, the reception device has a counter with which cycles of a signal that oscillates at the resonant frequency can be counted, and the counter is fashioned to emit a counter reading that is one indicator for the electrical charge of a current that corresponds to the magnetic field to be measured. When the specimen of the magnetometer is arranged within an electrical coil in which this current flows, a current-time integral of the current can be directly measured and is available as a digital quantity as the counter reading emitted by the counter.

In another embodiment, the transmission device has a phase shifter for generating at least a 180° phase shift of the transmission signal. This 180° phase shift can thereby be generated either following a prescribable time duration or dependent on the amplitude of the mixed signal. As a result, the signal amplitude of the mixed signal, that decreases overtime, is maintained at a relatively high level by re-exciting the spins in the specimen, so that a consistently high signal-to-noise ration can be achieved. In particular, the generation of 180° phase shifts dependent on the amplitude of the mixed signal has the advantage that changes in the $T_2$ decay time of the specimen—due, for example, to field inhomogeneities of the magnetic field to be measured—can be dynamically adapted.

In a further embodiment, the transmission device is fashioned such that a magnetization amplitude of the transmission signal is smaller by a factor of approximately $10^{-3}$ than the magnetic flux density to be measured. As a result, influence of the magnetization amplitude on the resonant frequency is negligible, so that it is not necessary to make a correction by a frequency component corresponding to the magnetization amplitude to be subsequently implemented for the resonant frequency that has been filtered out.

In another embodiment, the nuclear magnetic spin or electron spin magnetometer has a magnetic field generator for generating a static magnetic field the pre-polarizes the specimen. As a result, a magnetic flux density with a value of zero can be unambiguously identified and detected with the magnetometer.

DESCRIPTION OF THE DRAWINGS

FIG. 7 shows the a spectrum of the temporal signal curve of FIG. 6.

DESCRIPTION OF THE PREFERRED EMBODIMENTS

Figure 1:
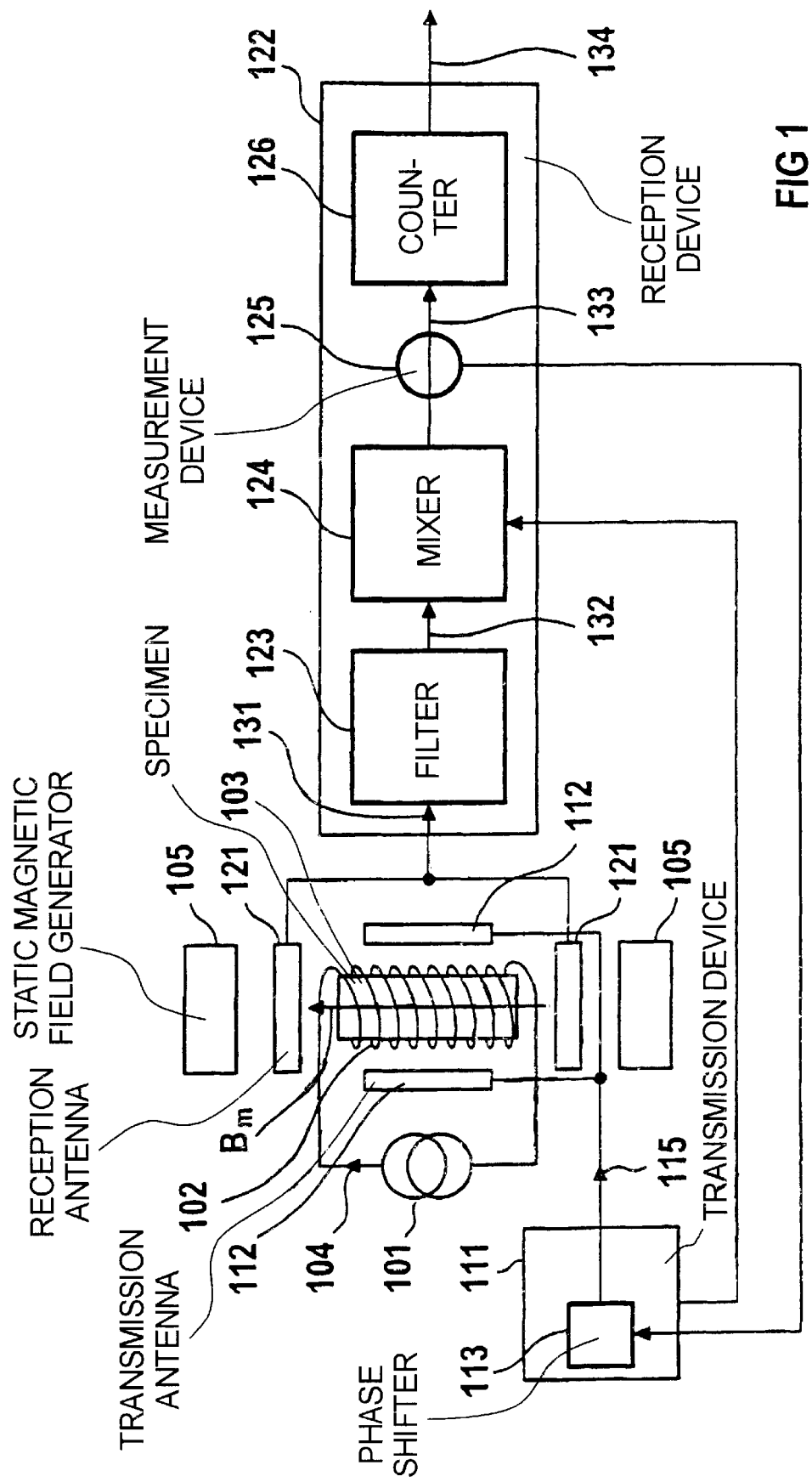
FIG. 1 is a block diagram of a nuclear magnetic spin or electron spin magnetometer in accordance with the invention.

As an exemplary embodiment of the invention, FIG. 1 shows a block diagram of a nuclear magnetic spin or electron spin magnetometer for measuring a magnetic field (shown as an arrow) with a magnetic flux density $B_m$. The magnetic field to be measured is a magnetic field that appears within a measurement volume defined by a cylindrical coil 102 having a current flowing therein. The coil 102 is electrically connected to a current source 101 that impresses a source current 104 into the coil 102 that is directly proportional to the magnetic flux density $B_m$ of the magnetic field to be measured.

At least one specimen 103 is disposed in the measurement volume within the coil 102 of the magnetometer, the specimen 103 being composed of material that exhibits nuclear magnetic resonance or electron spin resonance. The magnetometer has a transmission device 111 with transmission antennas 112 for emitting a transmission signal 115 as a radio-frequency signal as well as a reception device 122 with reception antennas 121 for receiving a mixed signal 131 from the specimen 103. The transmission antennas 112 radiate the transmission signal 115 into the specimen 103 at an essentially fixed transmission frequency $\omega_1$. The frequency $\omega_1$ is selected such that it is clearly spaced in the frequency range from a resonant frequency $\gamma \cdot B_m$ of the material of the specimen 103 that produces nuclear magnetic or electron spin resonance. The resonant frequency $\gamma \cdot B_m$ is dependent on the magnetic flux density $B_m$ of the magnetic field being measured and the gyromagnetic relationship $\gamma$ of the material. Further, a magnetization amplitude $B_1$ of the transmission signal is set so that it is lower by a factor of about $10^{-3}$ than the magnetic flux density $B_m$ of the magnetic field to be measured, so that the resonant frequency $\gamma \cdot B_m$ is not significantly modified due to the magnetization amplitude $B_1$ of the transmission signal 115.

The reception antennas 121 are fashioned for the reception of a mixed signal 131 from the specimen 103. In the context of frequency-resolution, the mixed signal 131 thereby contains a component at the transmission frequency $\omega_1$ and parts with mixed frequencies that derive from the resonant frequency $\gamma \cdot B_m$ of the specimen 103 and the transmission frequency $\omega_1$. In the reception device 122, the mixed signal 131 is first supplied to a filter 123. The filter 123 filters a mixed signal component 132 oscillating at one of the mixed frequencies from the mixed signal 131. Thereafter, the mixed signal component 132 is supplied to a mixer 124 for mixing the filtered mixed signal 132 with a signal oscillating at the transmission frequency $\omega_1$ for eliminating the transmission frequency $w_1$ from the filtered mixed signal 132. To this end, the mixer 124 is connected to the transmission device 111. A signal 133 at the output of the mixer 124 and oscillating at the resonant frequency $\gamma \cdot B_m$ is supplied to a counter 126 via a measurement device 125. The counter 126 counts zero-axis crossings of the signal 133 supplied to it and for emits a corresponding count 134. The number of cycles of the signal 133 oscillating at the resonant frequency $\gamma \cdot B_m$ is thereby directly proportional to a time integral of the source current 104.

The measurement device 125 is fashioned for acquiring an amplitude of the signal 133 oscillating at the resonant frequency $\gamma \cdot B_m$ and is connected to a phase shifter 113 within the transmission device 111 for generating a 180° phase shift of the transmission signal 115. If the amplitude falls below a prescribable limit, then a 180° phase shift is inserted into the transmission signal 115, so that the spin ensemble of the specimen 103 is re-excited. In another embodiment, the re-excitation of the spin ensemble is not amplitude-dependent, but occurs periodically after expiration of a permanently prescribable time duration.

Further, the magnetometer has a magnetic field generator 105 for generating a static magnetic field in the direction of the magnetic field to be measured, this allows a mixed signal 131 containing mixed frequencies still to be measured given a source current 104 equal to zero. The count 134 of the counter 126 is thereby correspondingly corrected by this static magnetic field.

In one embodiment wherein the magnetization amplitude $B_1$ of the transmission signal 115 assumes several tenths of a percent or even a few percent of the magnetic flux density of the magnetic field to be measured, a variation of the resonant frequency $\gamma \cdot B_m$ by $\gamma \cdot B_1$ is no longer negligible, so that the identified resonant frequency is to be correspondingly corrected by the magnetization amplitude $B_1$.

Figure 2:
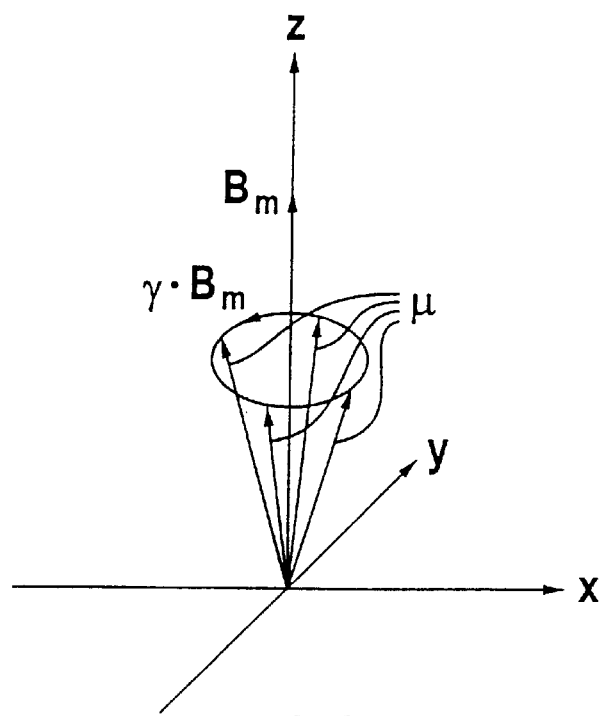
FIG. 2 illustrates a spin distribution of a specimen of the magnetometer before an activation of a transmission signal.

For explaining the functioning of an inventive magnetometer, FIG. 2 shows a distribution of an ensemble of spins $\mu$ of the specimen 103 of material that exhibits nuclear magnetic resonance. The spins $\mu$ precess on a conical surface with the resonant frequency $\gamma \cdot B_m$ dependent on the magnetic field to be measured. For clarity, the precession cone is only shown in the positive z-direction, which, according to the Boltzmann distribution, represents the more highly occupied low energy spin state. The magnetic field under measurement, having the magnetic flux density $B_m$, is thereby oriented in the positive z-direction. Although all of the spins $\mu$ precess with the same resonant frequency $\gamma \cdot B_m$, they exhibit a statistically distributed phase relation relative to one another, so that a macroscopic nuclear magnetization can in fact be measured in the z-direction, but no magnetization can be detected in the x-y plane.

Figure 3:
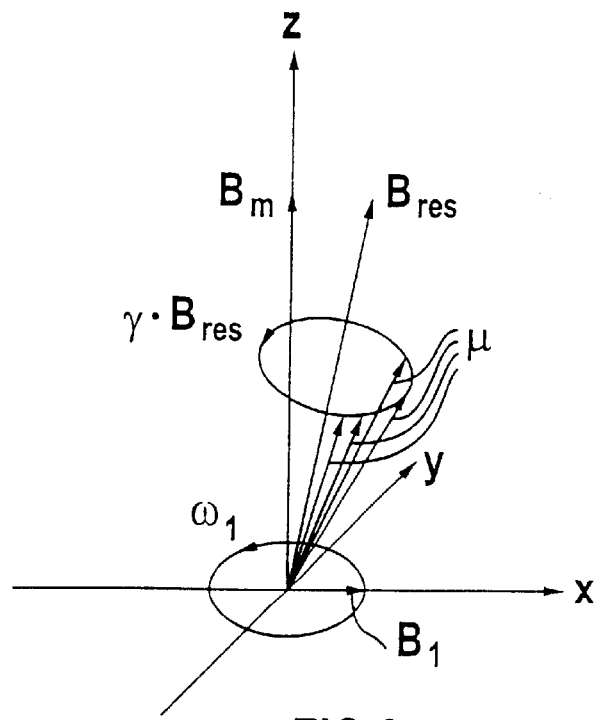
FIG. 3 illustrates a spin distribution of the specimen of the nuclear magnetic magnetometer immediately after the activation of the transmission signal.

FIG. 3 shows a spin distribution immediately after an activation of the transmission device 111, which emits a transmission signal 115 with a fixed magnetization amplitude $B_1$ and a fixed frequency $\omega_1$ in the x-y plane into the nuclear magnetic resonance-producing specimen 103. In FIG. 3, the transmission signal 115 is represented by a vector having the magnetization amplitude $B_1$ that rotates in the x-y plane with the frequency $\omega_1$. A resultant magnetic field $B_{res}$, which orbits around the z-axis with the frequency $\omega_1$ on a path describing a conical surface as the vector in the illustration, derives from the magnetic flux density $B_m$ to be measured as well as from the magnetization amplitude $B_1$. The spins $\mu$ continue to precess around the resultant magnetic field vector $B_{res}$ rotating on a conical surface, but with a resonant frequency $\gamma \cdot B_{res}$. With the condition that the magnetization amplitude $B_1$ is far lower than the magnetic flux density $B_m$ to be measured, $\gamma \cdot B_{res} \approx \gamma \cdot B_m$ applies for the resonant frequency. Further, the activation of the transmission signal 115 leads to a phase synchronization, at least for a portion of the spins, so that a measurable macroscopic magnetization that can be measured by the reception device 122 arises in the x-y plane. As can be clearly seen on the basis of FIG. 3 the received mixed signal 131 contains components at the transmission frequency $\omega_1$ as well as components with mixed frequencies $|\omega_1 \pm \gamma \cdot B_{res}|$. Given a projection into the x-y plane, the tips of the vectors representing the spins $\mu$ thereby sweep an elliptical path due to their precessional motion with $\gamma \cdot B_{res}$. According to Kepler's Laws, this motion on the elliptical path can be described by two circular motions with radian frequencies that are equal in magnitude but oppositely directed. The frequency components $\pm \gamma \cdot B_{res}$ in the mixed frequencies unambiguously derive therefrom.

Figure 4:
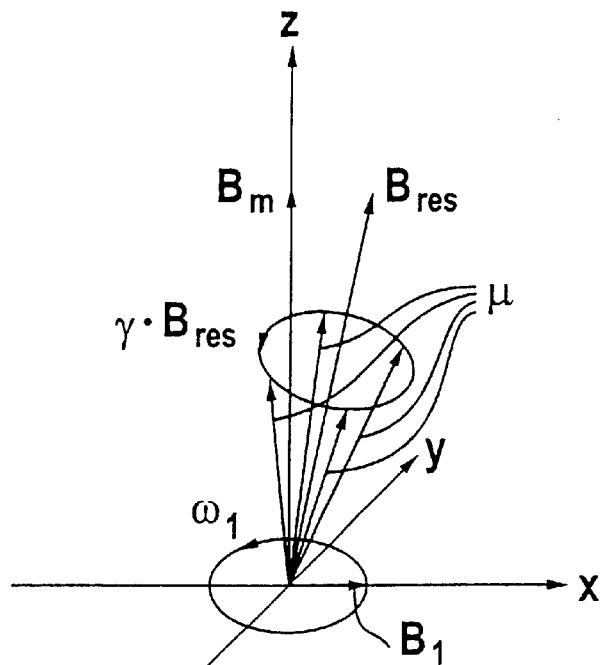
FIG. 4 illustrates a spin distribution of the specimen of the magnetometer after a time period following the activation of the transmission signal.

FIG. 4 shows a further spin distribution that arises from the spin distribution of FIG. 3 after the lapse of a specific time. As a result of relaxation processes, a loss of phase coherence of the spins $\mu$ that increases with the passage of the time occurs, so that the receivable macroscopic magnetization in the x-y plane decreases more and more. The loss of phase coherence is shown in FIG. 4 in that the four spins μ precess with a large phase incoherence among one another.

Figure 5:
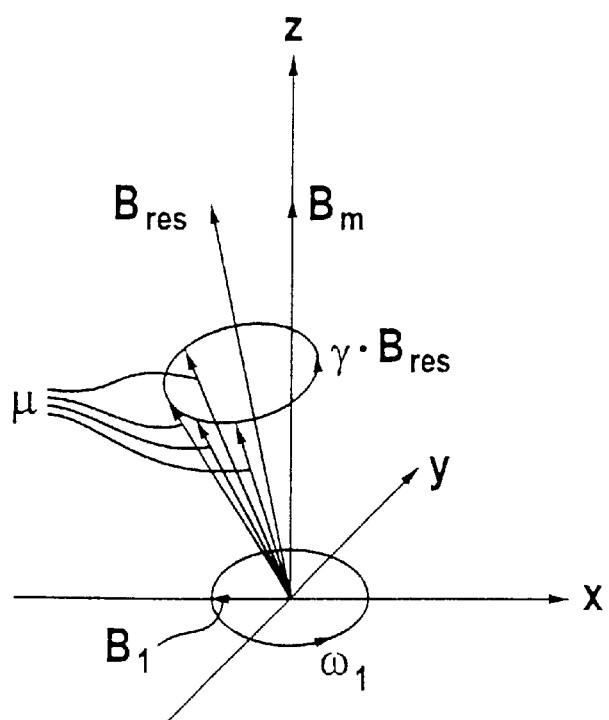
FIG. 5 illustrates a spin distribution of the specimen of the magnetometer immediate after a 180° phase shift of the transmission signal.

FIG. 5 shows another spin distribution that arises immediately after a 180° phase shift of the transmission signal 115 with respect to the spin distribution of FIG. 4. Similar to the activation of the transmission signal 115 in FIG. 3, the 180° phase shift of the transmission signal 115 leads to a phase synchronization at least in a part of the spins μ, so that a clearly measurable macroscopic magnetization is again formed in the x-y plane.

Figure 6:
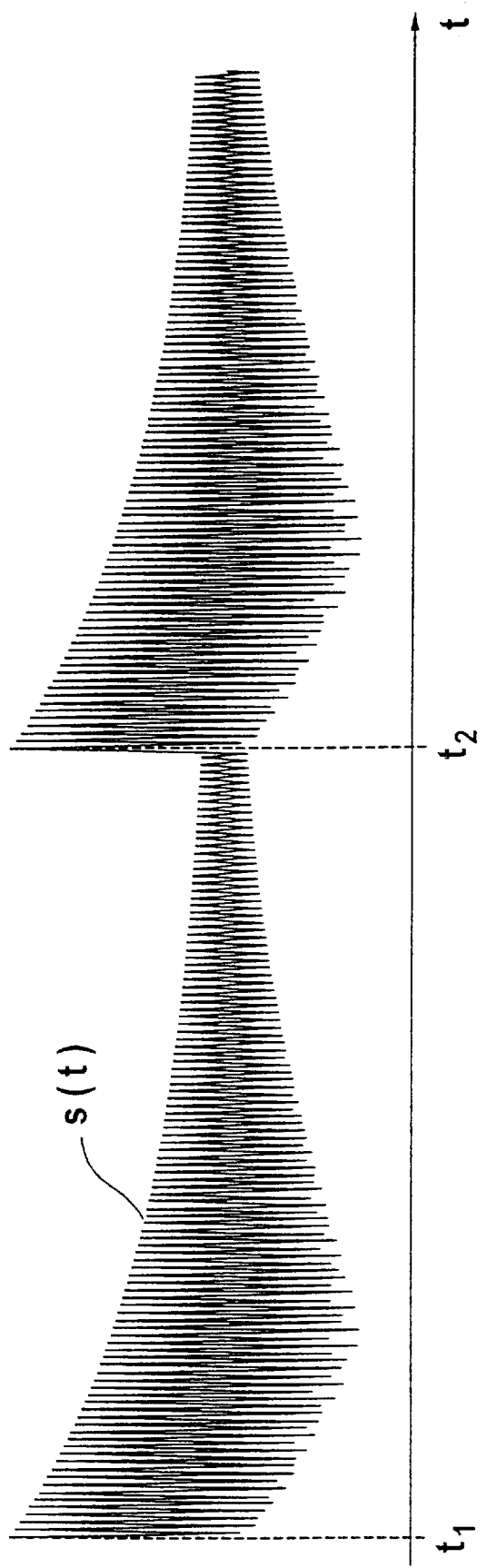
FIG. 6 shows a temporal signal curve of a measurable mixed signal obtained by the inventive magnetometer.

As an example, FIG. 6 shows a temporal signal curve s(t) of the mixed signal measurable in the x-y plane over the time t. The signal curve s(t) thereby begins at a point in time $t_1$ with the activation of the transmission signal 115. A 180° phase shift is generated in the transmission signal 115 at a second point in time $t_2$ at which an amplitude of the signal curve s(t) drops below a prescribable limit value as a consequence of relaxation processes of the specimen material, so that the spin ensemble and, thus, the signal curve s(t) is re-excited at time $t_2$.

As an example, FIG. 7 shows a spectrum S(ω) of the temporal signal curve s(t), wherein a longer time duration of the signal curve s(t) is shown than that shown in FIG. 6, and which contains four 180° phase shifts. The spectrum S(ω) is logarithmically shown in the amplitude direction. For aiding in a clear recognition of the dominant frequencies of the mixed signal 131, the magnetization amplitude $B_1$ of the transmission signal 115 is selected comparatively large at about 2% of the magnetic flux density $B_m$ of the magnetic field to be measured. The dominant frequencies of the mixed signal 131 can be clearly derived from the spectrum S(ω): these are the transmission frequency $\omega_1$ and the mixed frequencies $|\omega_1 \pm \gamma \cdot B_{res}|$ that contain the resonant frequency $\gamma \cdot B_{res}$ and the transmission frequency $\omega_1$.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetometer for measuring a magnetic field associated with nuclear magnetic spins or electron spins, comprising:

a measurement volume adapted to receive a specimen of a material that exhibits resonance selected from the group consisting of nuclear magnetic resonance and electron spin resonance, said material having a resonant frequency that is dependent on a magnetic flux density of a magnetic field, associated with the resonance, which is to be measured;

a transmission device disposed for emitting a transmission signal into said specimen in said measurement volume at a selected transmission frequency having a frequency spacing from said resonant frequency; and a reception device disposed for receiving a mixed signal from said specimen containing mixed frequencies including the resonant frequency and the transmission frequency, said reception device filtering out said resonant frequency from said mixed frequencies in said mixed signal to obtain a filtered out signal which is representative of said magnetic flux density.

2. A magnetometer as claimed in claim 1 wherein said reception device comprises a filter for filtering a mixed signal component from said mixed signal at one of said mixed frequencies.

3. A magnetometer as claimed in claim 2 wherein said reception device further comprises a mixer, supplied with said mixed signal component, for acquiring a signal at said resonant frequency from a signal at said transmission frequency and said mixed signal component.

4. A magnetometer as claimed in claim 1 wherein said reception device includes a counter which counts cycles of the filtered out signal at said resonant frequency, said counter emitting a counter output indicative of a time integral of said magnetic flux density of said magnetic field.

5. A magnetometer as claimed in claim 1 wherein said transmission device comprises a phase shifter for generating at least 180° phase shift of said transmission signal.

6. A magnetometer as claimed in claim 5 wherein said transmission device emits said transmission signal at an initial time, and wherein said phase shifter generates said 180° phase shift at a predetermined time after said initial time.

7. A magnetometer as claimed in claim 5 wherein said mixed signal has an amplitude, and wherein said phase shifter generates said 180° phase shift dependent on the amplitude of the mixed signal.

8. A magnetometer as claimed in claim 1 wherein said transmission device emits said transmission signal with a magnetization amplitude that is smaller by a factor of approximately $10^3$ than said magnetic flux density.

9. A magnetometer as claimed in claim 1 further comprising a magnetic field generator which generates a static magnetic field in said measurement volume that prepolarizes said specimen.

10. A magnetometer as claimed in claim 1 further comprising an electrical coil having a current flow therein, said coil having an interior defining said measurement volume and said current flowing therein producing said magnetic field in said measurement volume.

* * * * *